United States Patent
Subramani et al.

(10) Patent No.: US 6,589,407 B1
(45) Date of Patent: Jul. 8, 2003

(54) ALUMINUM DEPOSITION SHIELD

(75) Inventors: Anantha Subramani, San Jose, CA (US); Ashok K. Das, Sunnyvale, CA (US); Leif E. DeLaurentis, Boulder Creek, CA (US); Michael Rosenstein, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 629 days.

(21) Appl. No.: 08/862,537

(22) Filed: May 23, 1997

(51) Int. Cl.[7] .............................................. C23C 14/34
(52) U.S. Cl. .............................. 204/298.11; 204/298.06
(58) Field of Search ........................ 204/298.11, 298.06

(56) References Cited

U.S. PATENT DOCUMENTS

| | | | | |
|---|---|---|---|---|
| 4,512,283 A | | 4/1985 | Bonifield et al. ............ | 118/723 |
| 4,999,096 A | * | 3/1991 | Nihei et al. ......... | 204/298.06 X |
| 5,178,739 A | * | 1/1993 | Barnes et al. ....... | 204/298.06 X |
| 5,380,414 A | * | 1/1995 | Tepman ............. | 204/298.11 X |
| 5,391,275 A | * | 2/1995 | Mintz ................ | 204/298.11 X |
| 5,419,029 A | * | 5/1995 | Raaijmakers ...... | 204/298.11 X |
| 5,482,612 A | * | 1/1996 | Armstrong et al. .... | 204/298.11 |
| 5,538,603 A | * | 7/1996 | Guo ................... | 204/298.11 X |
| 5,632,873 A | * | 5/1997 | Stevens et al. ...... | 204/298.11 X |
| 5,639,357 A | * | 6/1997 | Xu ..................... | 204/298.06 X |
| 5,690,795 A | * | 11/1997 | Rosenstein et al. . | 204/298.11 X |
| 5,705,042 A | * | 1/1998 | Leiphart et al. .... | 204/298.11 X |

FOREIGN PATENT DOCUMENTS

| EP | 0 446 657 A1 | 2/1991 |
|---|---|---|
| EP | 0 836 219 A2 | 10/1997 |

OTHER PUBLICATIONS

PCT International Search Report, International Application No. PCT/US 98/10223, 3 pages.

* cited by examiner

*Primary Examiner*—Rodney G. McDonald
(74) *Attorney, Agent, or Firm*—Moser, Patterson & Sheridan LLP

(57) ABSTRACT

An aluminum deposition shield substantially improves transfer of radiated heat from within the vacuum chamber, in comparison to a stainless steel deposition shield. The aluminum deposition shield remains cooler during wafer processing and assists in cooling the chamber components.

20 Claims, 2 Drawing Sheets

ALUMINUM DEPOSITION SHIELD

FIELD OF THE INVENTION

The present invention relates to an apparatus for processing wafers in a vacuum chamber. More particularly, the invention relates to an apparatus for removal of heat from a vacuum chamber.

BACKGROUND OF THE RELATED ART

Connecting a power source, such as a radio frequency ("RF") power source, to a device, such as an RF antenna coil, through the wall of a vacuum chamber typically involves providing an insulated passage through one or more deposition shields. Application of RF energy to the coil tends to generate heat within the chamber. This heat is dissipated through radiation and conduction to heat sinks typically the shield, target, etc. within the chamber. Deposition shields are typically constructed of stainless steel for strength and tend to be negatively charged or grounded during wafer processing. Furthermore, the shield accumulates heat during wafer processing and chamber cooling declines unless the additional heat is removed from the shield. There is a need, therefore, for a deposition shield which avoids build up of additional heat within the vacuum chamber.

SUMMARY OF THE INVENTION

The present invention provides an aluminum deposition shield which substantially improves transfer of radiated heat from within the vacuum chamber, to external chamber components in comparison to a conventional stainless steel deposition shield. The aluminum deposition shield remains cooler during wafer processing and assists in cooling the chamber components.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. The appended drawings illustrate typical embodiments of this invention and are not to be considered limiting of its scope, for the invention may admit to other equally effective embodiments.

DETAILED DESCRIPTION OF THE INVENTION

Figure 1:
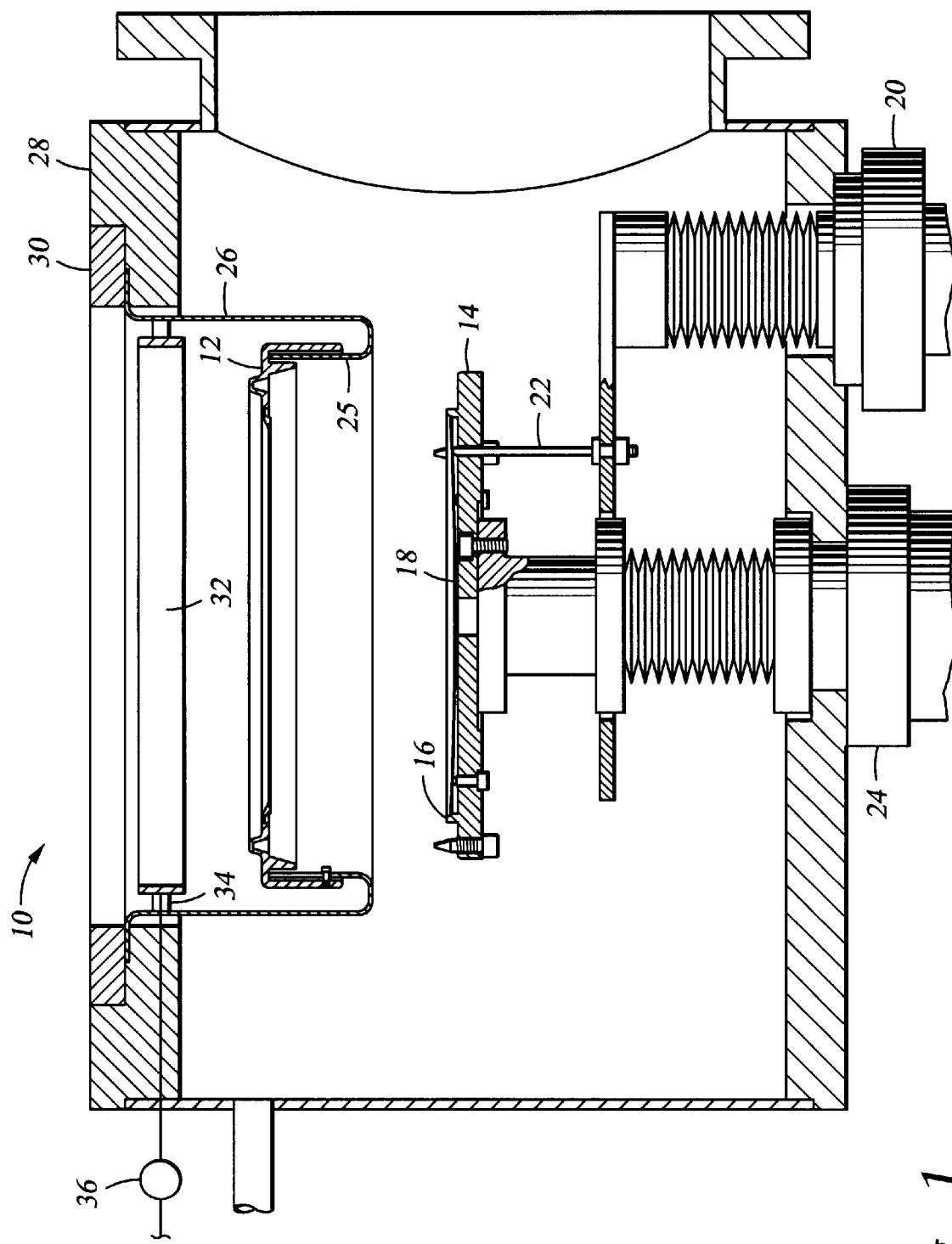
FIG. 1 is a sectional view of a vacuum deposition chamber (without a target assembly) showing an external RF power source connected to a flat RF electrode coil within an aluminum deposition shield.

The present invention provides an aluminum deposition shield within a vacuum chamber to enhance removal of radiated or conducted heat from an internal heat source such as an RF electrode. The vacuum chamber can be any plasma enhanced processing chamber wherein external RF or DC power is connected to a device within the vacuum chamber. Cooling of the vacuum chamber is enhanced since aluminum has a higher heat transfer co-efficient in comparison to stainless steel.

The aluminum deposition shields are especially useful for cooling an electrode within a high density plasma vacuum semiconductor processing chamber such as the VECTRA® IMP chamber available from Applied Materials, Inc. of Santa Clara, Calif. The high vacuum chambers are used for physical vapor deposition (PVD) of Aluminum, Titanium, Copper, Tantalum, Tantalum Nitride, or Titanium Nitride layers to form conductors or barrier layers on semiconductor wafers. One or more VECTRA® IMP chambers are typically mounted on a semiconductor processing platform such as the ENDURA® platform manufactured by Applied Materials, Inc.

The invention is further described by reference to a specific aluminum deposition shield shown in the drawings, and by reference to comparisons to deposition shields made from other materials.

As shown in FIG. 1, the present invention relates to a useful apparatus for processing a substrate in a semiconductor processing chamber 10. The processing chamber 10 typically includes a clamp ring 12 and a support member 14 disposed in the processing chamber 10, and a substrate alignment member 16 located on the support member 14. The substrate alignment member 16 aligns a substrate 18 with the support member 14 under gravity feed as the substrate is received on the support member 14. A substrate lift mechanism 20 moves pins 22 to receive the substrate prior to processing in the chamber. A support lift mechanism 24 raises the support member 14 so that the support member 14 picks up the substrate 18 off the pins 22 prior to processing in the chamber, or lowers the support member 14 to place the substrate on the pins 22 for removal of the substrate after processing.

As the support member 14 continues moving upward in the chamber 10, the support member 14 passes into the clamp ring 12 which rests upon an aluminum deposition shield 26. An aluminum adapter 28 supports the aluminum deposition shield 26 and an insulator 30. The adapter 28 is a wall of the vacuum chamber and typically has passages (not shown) for cooling water. An external RF power source 36 supplies RF power to the antenna coil 32 which is externally grounded.

The coil 32 is supported within the chamber on a plurality of standoffs 34. The coil 32 is supplied with power to enable a gas, maintained at a vacuum pressure level in the chamber, to be energized into a plasma. The coil 32 may optionally be supplied with a coolant through a central passage.

To enable passage of the RF, or other, power to the coil 32, conductive elements must extend through the chamber wall, but they cannot contact the chamber wall which may be grounded, or, if contacted with the conductor, will become "hot." To provide this configuration, an insulated feed through (not shown) is typically extended though the adaptor.

The aluminum deposition shield must be thicker than a comparable stainless steel shield to provide equivalent strength. However, a higher heat transfer co-efficient provides better cooling. Preferably, the shield 26 is configured to have a thin lip 25 which engages the conventional clamp ring 12. The remainder of the shield 26 is thicker than comparable stainless steel shields unless a narrow region is needed for close tolerances.

Figure 2:
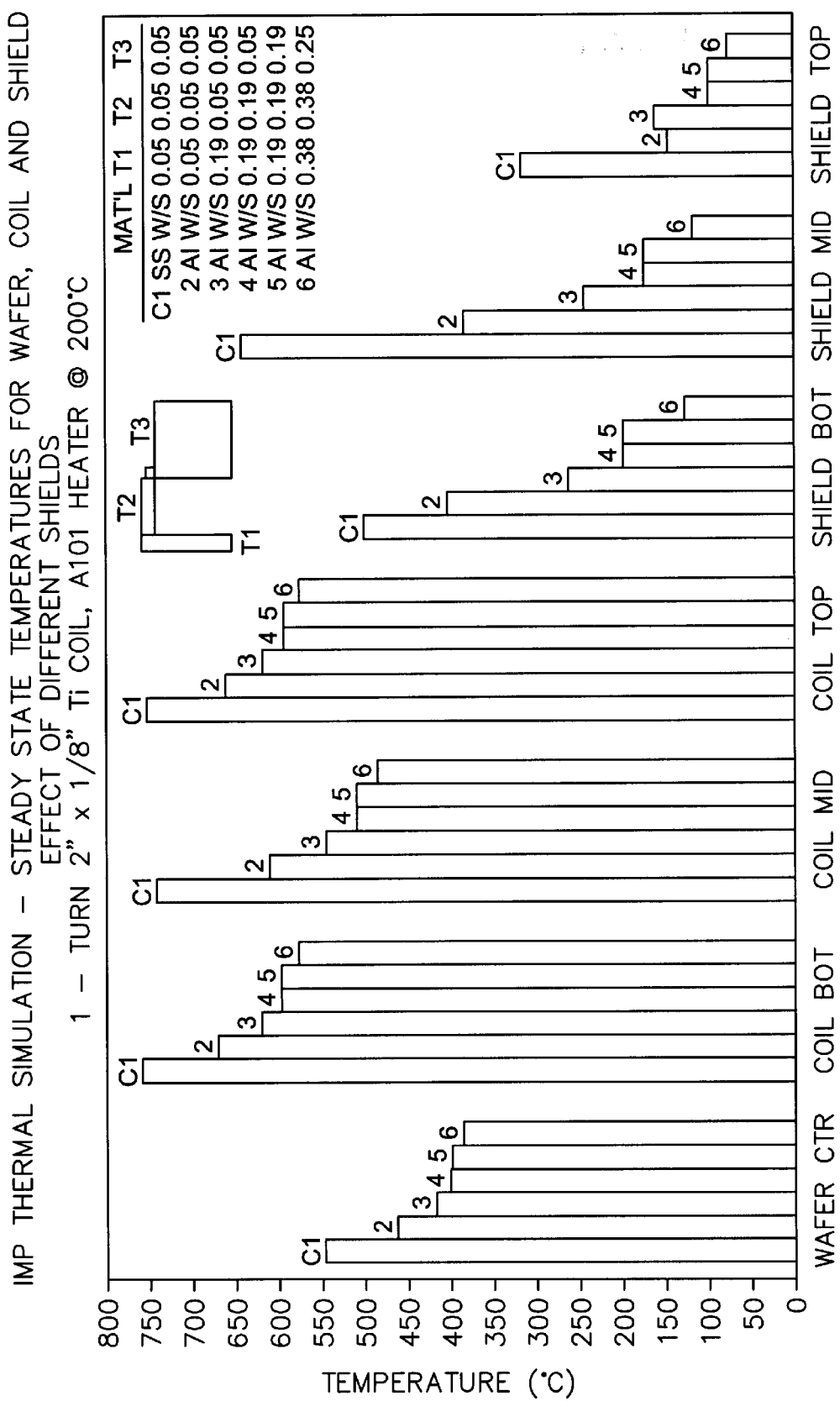
FIG. 2 compares the processing temperatures of deposition shields which are constructed from stainless steel or aluminum.

Performance of aluminum deposition shields Examples 2–6 of the present invention was simulated under wafer processing conditions and compared to a stainless steel shield Example C1. During wafer processing, the wafer was heated to 200° C. Each shield was supported by connectors which provides some convection of heat to the shield. Temperatures within the vacuum chamber were recorded at the wafer center, the shield bottom, the shield top, the shield middle, the coil bottom, the coil top, and the coil bottom. Thickness of the shields are shown in FIG. 2 along with the temperature measurements. The thicker aluminum shields 5,6 provided the lowest steady state shield temperatures.

While the foregoing is directed to the preferred embodiment of the present invention, other and further embodiments of the invention may be devised without departing from the basic scope thereof. The scope of the invention is determined by the claims which follow.

What is claimed is:

1. A wafer processing system, comprising:
    a high density plasma vacuum processing chamber;
    an aluminum deposition shield disposed within the vacuum chamber and adapted to cool a heat source; and
    a heat source positioned to radiate heat to be dissipated by the deposition shield.

2. The wafer processing system of claim 1, wherein the heat source is an RF antenna.

3. The wafer processing system of claim 1, wherein the vacuum chamber is an inductively coupled PVD processing chamber.

4. The wafer processing system of claim 2 wherein the RF antenna is a coil disposed within an interior space surrounded by the aluminum deposition shield.

5. The wafer processing system of claim 1 wherein the aluminum deposition shield comprises:
    i) an outer cylindrical portion surrounding the heat source the outer cylindrical portion having a first thickness;
    ii) a bottom portion extending radially inwardly from the cylindrical portion, the bottom portion having a second thickness; and
    iii) an upturned inner cylindrical portion extending from the bottom portion, the inner cylindrical portion having a third thickness.

6. The wafer processing system of claim 5 wherein the first thickness, the second thickness and the third thickness are about equally thick.

7. The wafer processing system of claim 5 wherein the first thickness and the second thickness are thicker than the third thickness.

8. The wafer processing system of claim 5 wherein the outer cylindrical portion has a first thickness between about 0.05 inches to about 0.38 inches, the bottom portion has a second thickness between about 0.05 inches to about 0.38 inches and the inner cylindrical portion has a third thickness between about 0.05 inches to about 0.25 inches.

9. A method for cooling a component in a high density plasma vacuum processing chamber, comprising:
    dissipating heat generated by the component using a deposition shield disposed within the chamber, wherein the deposition shield comprises a material having a higher heat transfer coefficient than stainless steel.

10. The method of claim 9, further comprising:
    b) surrounding the component with a cylindrical portion of the deposition shield.

11. The method of claim 10, further comprising:
    c) radiating heat from the component to the deposition shield.

12. The method of claim 11 wherein the component is an RF antenna.

13. The method of claim 11 wherein the deposition shield comprises aluminum.

14. The method of claim 11 wherein the cylindrical portion of the deposition shield has a thickness between about 0.05 inches to 0.38 inches.

15. The method of claim 14 wherein the deposition shield further comprises a bottom portion extending radially inwardly from the cylindrical portion and an upturned inner cylindrical portion extending from the bottom portion.

16. An apparatus for cooling a component in a high density plasma vacuum processing chamber, comprising:
    a deposition shield disposed within the chamber to dissipate heat generated by the component, wherein the deposition shield comprises a material having a higher heat transfer coefficient than stainless steel.

17. The apparatus of claim 16 wherein the component is an RF antenna disposed within an interior space of the deposition shield.

18. The apparatus of claim 17 wherein the deposition shield comprises aluminum.

19. The apparatus of claim 18 wherein the deposition shield comprises an outer cylindrical portion surrounding the RF antenna.

20. The apparatus of claim 19 wherein the outer cylindrical portion has a thickness between about 0.05 inches and about 0.38 inches.

* * * * *